United States Patent [19]
Hogan

[11] Patent Number: 6,156,647
[45] Date of Patent: Dec. 5, 2000

[54] BARRIER LAYER STRUCTURE WHICH PREVENTS MIGRATION OF SILICON INTO AN ADJACENT METALLIC LAYER AND THE METHOD OF FABRICATION OF THE BARRIER LAYER

[75] Inventor: Barry Hogan, Santa Clara, Calif.

[73] Assignee: Applied Materials, Inc., Santa Clara, Calif.

[21] Appl. No.: 08/958,472

[22] Filed: Oct. 27, 1997

[51] Int. Cl.⁷ .................................................. H01L 21/461
[52] U.S. Cl. ........................ 438/653; 438/685; 438/643
[58] Field of Search .................................. 438/653, 685, 438/643, 627

[56] References Cited

U.S. PATENT DOCUMENTS

| | | | |
|---|---|---|---|
| 4,944,961 | 7/1990 | Lu et al. | 427/38 |
| 4,990,997 | 2/1991 | Nishida . | |
| 5,175,608 | 12/1992 | Nihei et al. | 257/751 |
| 5,320,728 | 6/1994 | Tepman | 204/192.12 |
| 5,514,908 | 5/1996 | Liao et al. | 257/751 |
| 5,543,357 | 8/1996 | Yamada et al. | 437/192 |
| 5,663,088 | 9/1997 | Sandhu et al. | 438/396 |
| 5,723,382 | 3/1998 | Sandhu et al. | 438/653 |
| 5,895,266 | 4/1999 | Fu et al. | 438/648 |

OTHER PUBLICATIONS

B. Pécz et al., "Electron microscopy characterization of TiN films on Si, grown by d.c. reactive magnetron sputtering", *Thin Solid Films*, 268, pp. 57–63 (1995).

S.M. Rossnagel and J. Hopwood, "Metal ion deposition from ionized magnetron sputtering discharge", *J. Vac. Sci. Technol.* B, vol. 12, No. 1, pp. 449–453 (Jan./Feb. 1994).

U.S. Patent Application, Serial No. 08/511,825 of Xu et al., filed Aug. 7, 1995.

U.S. Patent Application Serial No. 08/824,911 of Ngan et al., filed Mar. 27, 1997.

U.S. Patent Application Serial No. 08/825,216 of Ngan et al., filed Mar. 27, 1997.

*Primary Examiner*—Caridad Everhart
*Attorney, Agent, or Firm*—Kenyon & Kenyon; Shirley L. Church

[57] ABSTRACT

An improved barrier layer structure for the prevention of migration within a semiconductor device can be formed from a refractory metal compound such as a refractory metal nitride. The preferred barrier layer structure includes at least two adjacent layers of essentially the same chemical composition having an essentially continuous interfacial region between them, wherein the interfacial region is at least 10 Å thick. As an alternative to having a continuous interfacial region, a series of adjacent layers which provide sufficient interfacial regions can be used in combination to block the migration of mobile atoms such as silicon. When a series of layers is used, there should be at least 3 layers, and preferably 5 or more layers, where each layer is at least about 50 Å thick. In addition, to break the continuity of channels passing through grain boundaries, alternating layers of substantially grain oriented, columnar microstructure and amorphous, non-columnar structure are preferred. The preferred embodiment used to demonstrate the invention is a titanium nitride-comprising barrier layer structure prepared using ion metal plasma or reactive ion metal plasma deposition techniques to create the interfacial regions.

12 Claims, 4 Drawing Sheets

BARRIER LAYER STRUCTURE WHICH PREVENTS MIGRATION OF SILICON INTO AN ADJACENT METALLIC LAYER AND THE METHOD OF FABRICATION OF THE BARRIER LAYER

BACKGROUND OF THE INVENTION

1. Field of the Invention

The present invention pertains to a barrier layer used in the formation of semiconductor devices. The barrier layer has a particular structure, and may be formed in a continuous process to reduce fabrication costs. In the most preferred embodiment, the barrier layer is titanium nitride which is used to line a contact via having a particularly high aspect ratio.

2. Brief Description of the Background Art

In the field of semiconductor device fabrication, particularly with the continuing trend toward smaller device feature sizes, the reliability of electrical contacts has become critical. This reliability is particularly threatened for contacts between aluminum and diffused junctions into single-crystal silicon, where the aluminum and silicon tend to interdiffuse. As is well known in the art, conventional integrated circuit process steps can cause aluminum atoms to diffuse from a metal electrode of pure aluminum into single-crystal silicon to such a depth as to short out a shallow p-n junction in the silicon; this phenomenon is known as junction spiking.

To prevent junction spiking, barrier layers have been introduced between the silicon and the overlying aluminum layer. Typically these barrier layers are formed of refractory metal compound such as titanium tungsten (TiW), or a refractory metal nitride such as titanium nitride (TiN).

U.S. Pat. No. 5,543,357 to Yamada et al., issued Aug. 6, 1996, describes a process for manufacturing a semiconductor device wherein a titanium film is used as an under film for an aluminum alloy film to prevent the device characteristics of the aluminum alloy film from deteriorating. The thickness of the titanium film is set to 10% or less of the thickness of the aluminum alloy film and at most 25 nm. In the case of the aluminum alloy film containing no silicon, the titanium film is set to 5% of less of the thickness of the aluminum alloy film. The aluminum film is formed at a substrate temperature of 200° C. or less by a sputtering process, and when the aluminum film or an aluminum alloy film is to fill a via hole, the substrate is heated to fluidize the aluminum. The pressure during the aluminum film formation and during the fluidization is lower than $10^{-7}$ Torr. A titanium nitride barrier layer may be applied on an interlayered insulating film (or over a titanium layer which has been applied to the insulating film), followed by formation of a titanium film over the titanium nitride film, and finally by formation of the aluminum film over the titanium film. After formation of the titanium nitride barrier layer, the barrier layer is heated to a temperature of about 600° C. to 700° C. in a nitrogen atmosphere using a halogen lamp so that any titanium which is not nitrided will become nitrided. The titanium nitride barrier layer is said to be a poor barrier layer if un-nitrided titanium is present within the layer.

To further improve the performance of TiN barrier layer properties, an oxide has been incorporated at grain boundaries within a titanium nitride film, to increase the ability of the film to prevent the mutual diffusion of silicon and aluminum through the barrier layer. Placement of the oxide at the grain boundaries is known as "oxygen stuffing". U.S. Pat. No. 5,514,908 to Liao et al., issued May 7, 1996, describes an even further improvement in an oxygen-stuffed TiN film, where a titanium silicide layer is formed at the exposed silicon surface, followed by the formation of a titanium oxynitride layer, followed by the titanium nitride layer. In a preferred embodiment of the invention, a porous titanium nitride layer is formed over the titanium metal from which the silicide is to be formed. The wafer is then exposed to an oxygen-bearing atmosphere, to allow oxygen to enter the film. Subsequently, the wafer is rapid thermal annealed to cause silicidation at the silicon-titanium interface and to cause the titanium nitride to densify into a high density film with a titanium oxynitride layer at the silicide/nitride interface.

The Liao patent referenced above describes a technique used to form a relatively low density titanium nitride where the reactive sputtering of titanium nitride is carried out at relatively cool substrate temperatures (on the order of 100° C.) and at relatively weak vacuum conditions (on the order of about 10 mT). This is contrasted with conventional high density titanium nitride which is reactive sputtered at substrate temperatures on the order of 300° C., and at vacuums of "at most" 4 mT to provide the large grain sizes and high density desired in the prior art to provide barrier layer performance.

B. Pecz et al. in an article entitled "Electron microscopy characterization of TiN films on Si, grown by D.C. reactive magnetron sputtering", *Thin Solid Films* 268 (1995) 57–63, describe the structural characteristics of titanium nitride films deposited by D.C. reactive magnetron sputtering on <001> silicon wafers. In particular, the shape and size of the titanium nitride crystallites were investigated as a function of deposition temperature, substrate bias voltage and nitrogen flow rate (nitrogen content of the process gases). The titanium nitride films are said to exhibit a columnar growth showing preferred orientation along <111> direction. The crystal orientation of the silicon substrate was not seen to affect the mode of crystallite growth. However, when the substrate bias was low, $V_b$ of –40V, intercolumnar voids formed along the grain boundaries. No significant changes in the morphology of the grains were observed over deposition temperatures ranging from room temperature to 550° C. At high flow rates of nitrogen, stoichiometric TiN was the only compound formed, however, at sufficiently low nitrogen flow rates, a film consisting of a mixture of $Ti_2N$ with a small amount of Ti is formed, and the columnar morphology is said to be absent.

A series of ten sequential layers deposited at different thicknesses, where the growth conditions for the TiN film were slightly varied. For example, the bias voltage was varied from –120V to –125V, and the nitrogen flow rate was varied from about 2.3 sccm to 2.5 sccm (within the nitrogen flow rates where stoichiometric TiN was the only compound formed). Distinct interfaces appeared between the sequential thin layers. However, when the deposition was interrupted (for periods up to 10 minutes) there was no change in the lattice of the TiN grains due to the interruption. The columnar morphology appeared at an early state of growth and was interrupted only at the interfaces where the growth conditions changed.

U.S. Pat. No. 4,944,961 to Lu et al., issued Jul. 31, 1990, describes a process for partially ionized beam deposition of metals or metal alloys on substrates, such as semiconductor wafers. Metal vaporized from a crucible is partially ionized at the crucible exit, and the ionized vapor is drawn to the substrate by an imposed bias. Control of substrate temperature is said to allow non-conformal coverage of stepped surfaces such as trenches or vias. When higher temperatures are used, stepped surfaces are planarized. The examples given are for aluminum deposition, where the non-conformal deposition is carried out with substrate temperatures ranging between about 150° C. and about 200° C., and the planarized deposition is carried out with substrate temperatures ranging between about 250° C. and about 350° C.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, January/February 1994. One of the examples given is for titanium nitride film deposition using reactive sputtering, where a titanium cathode is used in combination with a plasma formed from a combination of argon and nitrogen gases.

U.S. patent application Ser. No. 08/511,825 of Xu et al., filed Aug. 7, 1995, assigned to the assignee of the present application, and hereby incorporated by reference in its entirety, describes a method of forming a titanium nitride-comprising barrier layer which acts as a carrier layer. The carrier layer enables the filling of apertures such as vias, holes or trenches of high aspect ratio and the planarization of a conductive film deposited over the carrier layer at reduced temperatures compared to prior art methods.

A "traditionally sputtered" titanium nitride-comprising film or layer is deposited on a substrate by contacting a titanium target with a plasma created from an inert gas such as argon in combination with nitrogen gas. A portion of the titanium sputtered from the target reacts with nitrogen gas which has been activated by the plasma to produce titanium nitride, and the gas phase mixture contacts the substrate to form a layer on the substrate. Although such a traditionally sputtered titanium nitride-comprising layer can act as a wetting layer for hot aluminum fill of contact vias, good fill of the via generally is not achieved at substrate surface temperature of less than about 500° C. To provide for aluminum fill at a lower temperature, Xu et al. (as described in U.S. patent application Ser. No. 08/511,825 now U.S. Pat. No. 5,962,923), developed a technique for creating a titanium nitride-comprising barrier layer which can act as a smooth carrier layer, enabling aluminum to flow over the barrier layer surface at lower temperatures (at temperatures as low as about 350° C., for example). A typical barrier layer described by Xu et al., is a combination of three layers including a first layer of titanium (Ti) deposited over the surface of the via; a second layer of titanium nitride (TiN) is deposited over the surface of the first titanium layer; finally a layer of $TiN_x$ is deposited over the TiN second layer. The three layers are deposited using Ion Metal Plasma (IMP) techniques which are described subsequently herein. Typically the first layer of titanium is approximately 100 Å to 200 Å thick; the second layer of TiN is about 800 Å thick, and the third layer of $TiN_x$ is about 60 Å thick. A good fill of contact vias having 0.25μ diameter through holes having an aspect ratio of about 5 was achieved.

U.S. patent application Ser. No. 08/825,216 of Ngan et al., filed Mar. 27, 1997 now U.S. Pat. No. 5,925,225, discloses various process techniques which can be used to control the crystal orientation of a titanium nitride barrier layer as it is deposited. By producing a titanium nitride barrier layer having a high <111> grain orientation content, the <111> grain orientation of an overlying aluminum layer is increased, whereby the electromigration properties of the aluminum are improved.

U.S. patent application Ser. No. 08/824,911 of Ngan et al., filed Mar. 27, 1997 discloses improved $Ti/TiN/TiN_x$ barrier/wetting layer structures which enable the aluminum filling of high aspect vias while providing an aluminum fill exhibiting a high degree of aluminum <111> grain orientation.

Although deposition of a metallic interconnect layer which exhibits a reduced tendency for electromigration and for general diffusion of the metal from the metallic layer is helpful, there is still the problem of the migration of mobile silicon atoms during device fabrication. The use of oxygen stuffing reduces the silicon migration problem, but requires a thermal annealing which is time consuming and increases the cost of the fabrication equipment. It would, then, be highly desirable to have a barrier layer structure which prevents silicon migration without the need for oxygen stuffing and without the need for high temperature annealing of the barrier layer structure (as required for oxygen stuffing and for the formation of a silicide layer).

SUMMARY OF THE INVENTION

An improved barrier layer structure for the prevention of migration within a semiconductor device can be formed from a refractory metal compound such as a refractory metal nitride. The barrier layer structure includes at least two adjacent layers of essentially the same chemical composition having an essentially continuous interfacial region between them, wherein the interfacial region is at least 10 Å thick. As an alternative to having a continuous interfacial region, a series of adjacent layers which provide sufficient interfacial regions can be used in combination to block the migration of mobile atoms such as silicon. When a series of layers is used, there should be at least 3 layers, and preferably 5 or more layers, where each layer is at least about 50 Å thick. In addition, to break the continuity of channels passing through grain boundaries, alternating layers of substantially grain oriented, columnar microstructure and amorphous, non-columnar structure are preferred.

The preferred embodiment used to demonstrate the invention is a titanium nitride-comprising barrier layer structure prepared using reactive ion metal plasma deposition techniques.

To create an interface between at least two layers, the process of layer deposition is altered to the extent during crystal formation that the majority of the grain orientation changes from one form to another form. An alternative interfacial structure is one in which one layer is deposited in a manner which provides a grain-oriented columnar or semi-columnar structure while an adjacent layer is deposited in a manner which disrupts crystal formation sufficiently that an amorphous, non-columnar structure is produced. Typically an amorphous structure is produced when approximately 50% or less of the structure exhibits a grain orientation.

When the barrier layer material is titanium nitride, to form a continuous interfacial layer, it is preferable to go immediately from a <111> TiN grain orientation to an amorphous TiN structure.

Changes from one grain orientation to another, or to no grain orientation are achieved by changes in the deposition process variables. In the physical vapor deposition process of ion metal plasma deposition (IMP) or reactive ion metal plasma deposition (RIMP), changes in grain orientation are achieved as follows. By increasing the DC power to the metal or metal-comprising target, a TiN <111> grain orientation can be obtained. When the substrate on which the barrier layer is to be deposited is not biased during deposition of the barrier layer, an increase in the RF power to the IMP ionization source is used to change a TiN <111> grain orientation to a <200> grain orientation. When RIMP is used to create the TiN, and there is less than a stoichiometric amount of nitrogen in the ionization area, an increase in the nitrogen flow to the reaction chamber can be used to increase the amount of <200> grain orientation. When the substrate is biased to attract ions toward the substrate surface, an increase in the substrate bias is used to produce a structure having no grain orientation. By manipulating this combination of variables, one can obtain the interfacial regions between layers of barrier material and improve the overall performance of the barrier structure.

A preferred embodiment method of forming the titanium nitride structure comprising at least two individual layers having a continuous interfacial region between them, wherein the interfacial region is at least 10 Å thick comprises the following steps:

a) IMP or RIMP depositing a layer of barrier layer material using a substrate bias power which enables the formation of an amorphous structure; and b) depositing at least one adjacent layer of barrier layer material in a manner which enables the formation of a structure wherein the majority of the structure has the same grain orientation.

Preferably the adjacent layer exhibiting grain orientation is also deposited using IMP or RIMP deposition techniques.

For a TiN barrier layer structure, preferably the grain orientation is <111>.

The most economical method of forming this barrier layer is to apply all of the layers in a continuous process without removing the semiconductor substrate from the process chamber. Since no high temperature annealing step is required to form the silicon-immobilizing barrier layer, fabrication in a single process chamber is easily carried out.

DETAILED DESCRIPTION OF THE PREFERRED EMBODIMENTS

Figure 1:
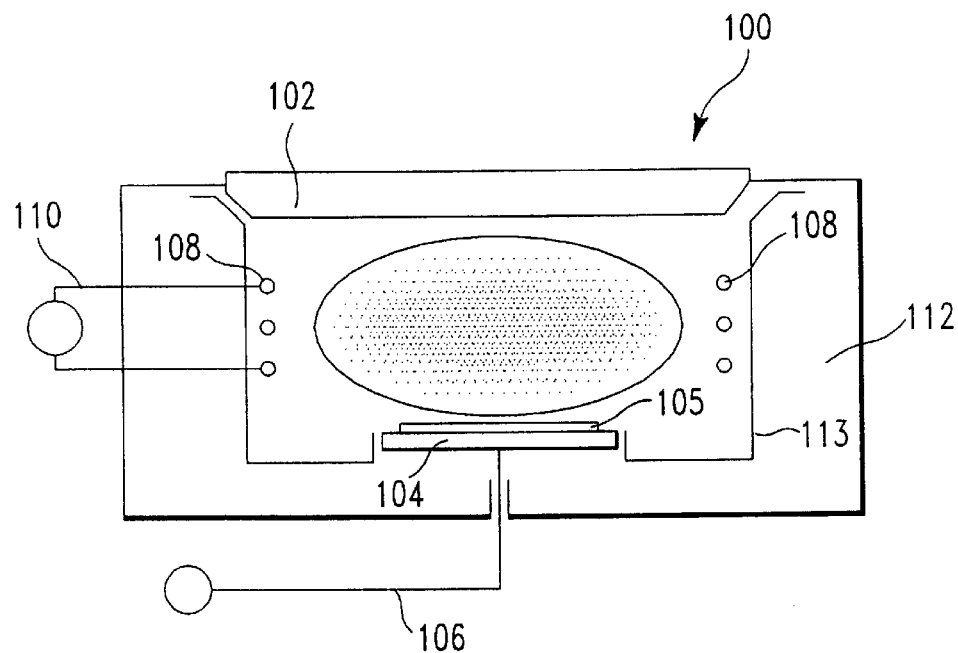
FIG. 1 shows a schematic of the critical elements of an ion metal plasma deposition or reactive ion metal plasma deposition process chamber, including a sputtering target, an RF powered coil for creating and maintaining ionized species within a plasma over the surface of the semiconductor substrate, and a means for application of RF power to the support platen on which the substrate sets, enabling the creation of a bias on the substrate.

An improved barrier layer for the prevention of the migration of silicon within a semiconductor device can be formed from a refractory metal compound or a refractory metal nitride by the creation of a structure comprising at least two individual layers having a continuous interfacial region between them, wherein the interfacial region is at least 10 Å thick. As an alternative to having a continuous interfacial region, a series of individual layers can be used to block the migration of the silicon. When a series of layers is used, there should be at least 3 layers, where each layer is at least 50 Å thick. In addition, to avoid the formation of channels which cross grain boundaries, alternating layers of highly grain oriented and amorphous structure are preferred.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example. The preferred embodiments described herein were for aluminum comprising about 0.5% copper.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "feature" refers to contacts, vias, trenches, and other structures which make up the topography of the substrate surface.

The term "ion-deposition sputtered" and the term "ion metal plasma" (IMP) refer to sputter deposition, preferably magnetron sputter deposition (where a magnet array is placed behind the target). A high density, inductively coupled RF source is positioned between the sputtering cathode and the substrate support electrode, whereby at least a portion of the sputtered emission is in the form of ions at the time it reaches the substrate surface.

The term "reactive ion deposition" or "reactive ion metal plasma" (RIMP) refers to ion-deposition sputtering wherein a reactive gas is supplied during the sputtering to react with the ionized material being sputtered, producing an ion-deposition sputtered compound containing the reactive gas element.

The term "Rutherford Backscattering Spectra" or "RBS" refers to a technique used to determine the composition and the atomic ratio of the components of a given barrier layer. RBS spectra are acquired by exposing a sample to an incident helium beam, with the sample perpendicular to the beam. Then data are collected using a normal angle detector and a glancing angle detector to measure backscattered helium ions at angles of 160°, and 100° or 95°, respectively. In the present instance the data are used to determine the composition of TiN layers.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

The term "XRD" (X-ray Diffraction) refers to a technique commonly used to measure crystalline orientation, wherein radiation over particular wavelengths is passed through the material to be characterized, and the diffraction of the radiation, caused by the material through which it passes, is measured. A map is created which shows the diffraction pattern, and the crystal orientation is calculated based on this map.

II. AN APPARATUS FOR PRACTICING THE INVENTION

A process system in which the method of the present invention may be carried out is the Endura® Integrated Processing System available from Applied Materials, Inc. of Santa Clara, Calif. In particular, one of the process chambers in the Endura® System can be used to produce sputter deposited barrier layer structures, and in particular, reactive ion metal plasma sputter deposited barrier layer structures.

The critical elements of a reactive ion metal plasma sputter deposition system are shown in a schematic format in FIG. 1. Process chamber 100 is used for the IMP deposition of a barrier layer such as a Ti/TiN/TiN$_x$ layer.

Process chamber 100 is typically is a magnetron chamber which employs a standard sputter magnet (not shown) to confine the sputtering plasma, enabling an increased sputtering rate. In addition, the process chamber includes an inductively coupled RF source 110, typically in the form of a coil 108, positioned between a sputtering cathode (target) 102 and the substrate support electrode 104, whereby at least a portion of the sputtered emission is in the form of ions at the time it reaches the substrate surface. An RF power source 106 is used to apply a bias to substrate support electrode 104, enabling formation of a DC bias on semiconductor substrate 105. Typically a shield 113 surrounds the area in which plasma 105 is created from gases which enter through channels 103. Shield 113 is surrounded by a vacuum chamber 112 which enables the evacuation of gases from the substrate processing area 107 through evacuation channels (not shown). In the preferred embodiment of the present invention where the barrier layer to be formed is a refractory metal nitride, titanium nitride, the refractory metal nitride is formed by sputtering a titanium target using techniques known in the art, where argon is gas used to create sputtering ions, and by adding nitrogen to the process chamber 100 through channels 103. At least a portion of the nitrogen is ionized as it passes by ionization coil 108. The reactive nitrogen is free to react with reactive titanium to form titanium nitride which is then attracted toward the surface of semiconductor substrate 105 by the bias placed on that substrate.

EXAMPLE ONE

To form the titanium-nitride (TiN$_x$) comprising barrier layer structures of the present invention,, a titanium target cathode of about 14 inches (35.5 cm) in diameter was used, and a DC power was applied to this cathode over a range from about 2.5 kW to about 5 kW. The substrate, comprising an 8 inch (20.3 cm) diameter silicon wafer, was placed a distance of about 5.5 inches (14 cm) from the target cathode. A high density, inductively coupled RF plasma was generated in the region between the target cathode and the substrate. The inductively coupled plasma was generated by applying RF power to a coil having at least one turn and preferably from about 1 to 3 turns. The power was applied at a frequency of about 2 MHz and at a wattage of about 2.5 kW. Typically the coil is fabricated from metal tubing which permits water cooling, and has a diameter of about 0.125 inch (0.32 cm). However, the coil can be fabricated from a sheet or ribbon, or other form which provides the desired function.

A substrate bias voltage ranging from 0 to about –300 V DC was applied to the substrate by application of RF power to the platen on which the substrate sets. The RF power at a frequency of about 400 kHz was applied at wattages ranging from zero W to about 450 W.

Depending on the desired composition of the TiN$_x$, where x ranged from about 0.8 to about 1.5, the amount of nitrogen gas fed to the chamber ranged from about 20 sccm of nitrogen to about 70 sccm of nitrogen, with a constant feed of argon at about 25 sccm, for plasma production and substrate heat transfer purposes.

III. THE COMPOSITION AND MICROSTRUCTURE OF THE TiN$_x$ BARRIER LAYER

The initial goal was to deposit a number of TiN$_x$ barrier layers using varying combinations of process conditions and to determine the effect of the combination of process conditions on the ability of the barrier layer structure to prevent the migration of underlying silicon through the barrier layer and into an overlying aluminum contact layer. As the work progressed, we discovered that a thick amorphous layer alone or a thick crystalline layer having a high degree of grain orientation was incapable of preventing the migration of the underlying silicon. The silicon would find one continuous conduit through the layer and travel up that conduit. We then decided we needed to break up the conduits within the barrier layer, by creating a stack of layers having interfaces between them. This could destroy any conduits traveling through an individual layer and block the silicon movement upward through the stack.

EXAMPLE TWO

Figure 2:
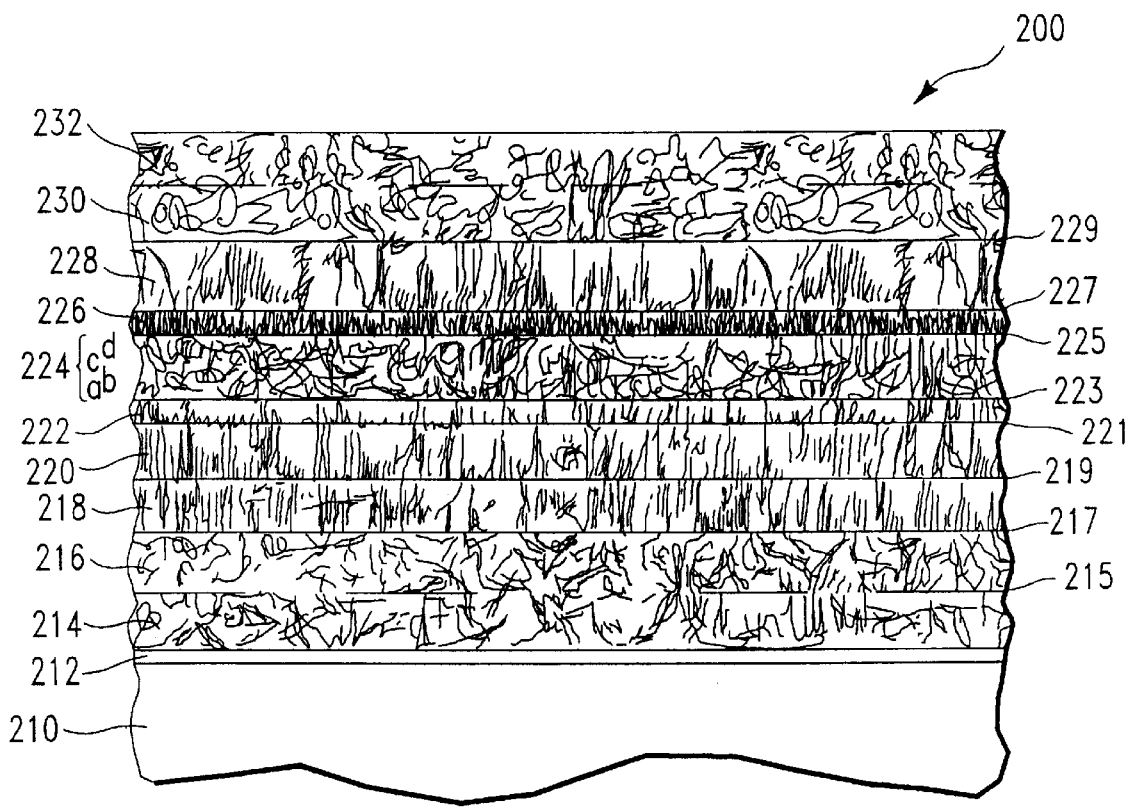
FIG. 2 is a schematic of a cross-sectional view of the microstructure of a barrier layer, produced using high resolution transmission electron microscopy tunneling electron microscope (TEM), where a plurality of layers have been deposited, with each layer produced under a different set of process condition variables, for evaluation of the effect of the set of variables on the composition and microstructure of each individual layer.
Figure 4:
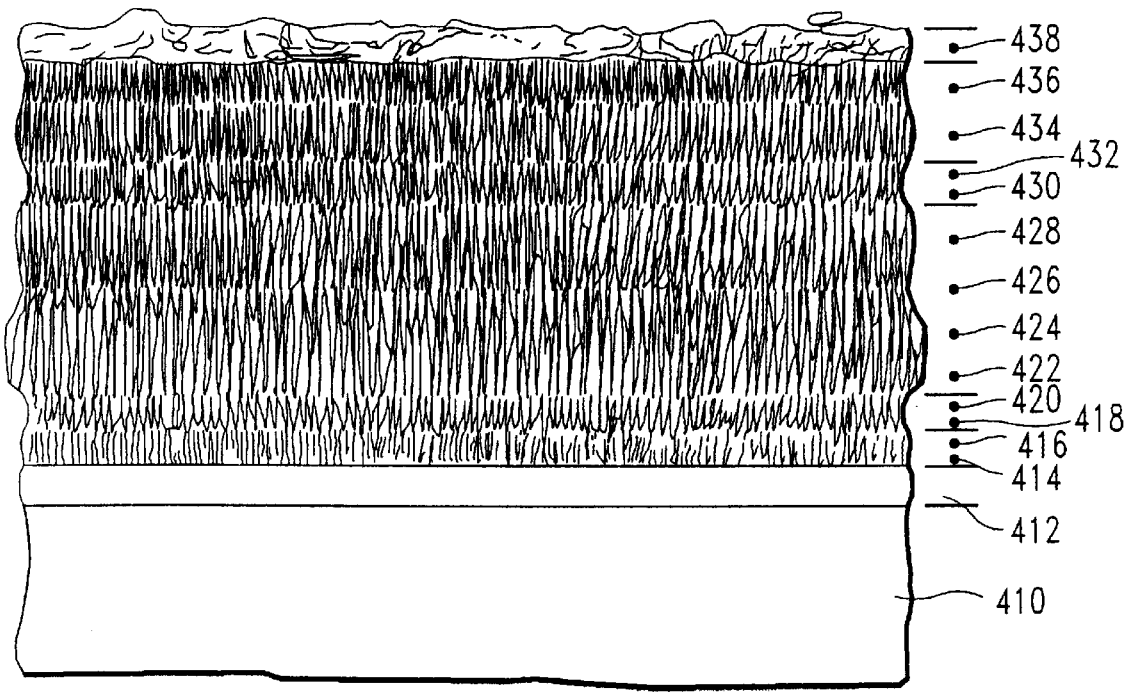
FIG. 4 is a schematic of a cross-sectional view of the microstructure (by TEM) of a second barrier layer structure where a plurality of layers have been deposited, with each layer produced under a different set of process condition variables, for evaluation of the effect of a set of variables on the composition and microstructure of each individual layer.

FIG. 2 illustrates the microstructure (TEM) of a multilayered barrier layer structure, where a series of TiN$_x$ layers were deposited under various combinations of process conditions. On the basis of information from this experiment, conditions were selected for future layer and interface development work. FIG. 4 illustrates the microstructure of a second multilayered barrier layer structure, where an additional series of TiN$_x$ layers were deposited to provide additional information. Table 1 which follows provides data obtained from the experiments illustrated in FIGS. 2 and 4. Table 1 lists the Figure which shows the microstructure of the layer, and the number of the layer which represents the particular specified process conditions.

The process conditions provided are: The DC power to the sputtering target; the RF power (at 2 MHz) to the ionization coil; the RF power (at 400 kHz) to the substrate support platen used to create a bias on the substrate; and the nitrogen feed rates to the process chamber. In addition to the nitrogen gas flow to the process chamber, there was consistently 25 sccm of argon, with 15 sccm to the substrate support platen as a heat transfer medium and 10 sccm to the upper portion of the chamber. The pressure in the process chamber was approximately 17.5 mT when the nitrogen flow rate was about 24 sccm. The process chamber pressure was about 35 mT when the nitrogen flow rate was about 64 sccm.

Table 1 also provides the thickness of an individual layer of TiN$_x$ applied in that process step; and, a description of the microstructure of the layer, which is defined as "C" (columnar), "SC" (semi-columnar), and "NC" (non-columnar). The layers deposited were flat layers and the first layer of titanium was deposited on a thermally grown silicon dioxide substrate, illustrated in FIG. 2 as layer 210. The substrate 210 temperature during deposition of the layers was approximately 100° C. Layer 212 was generally resputtered oxide.

the RF power to the substrate bias is off or at a low level, the structure of the TiN$_x$ is generally columnar in nature.

Figure 5:
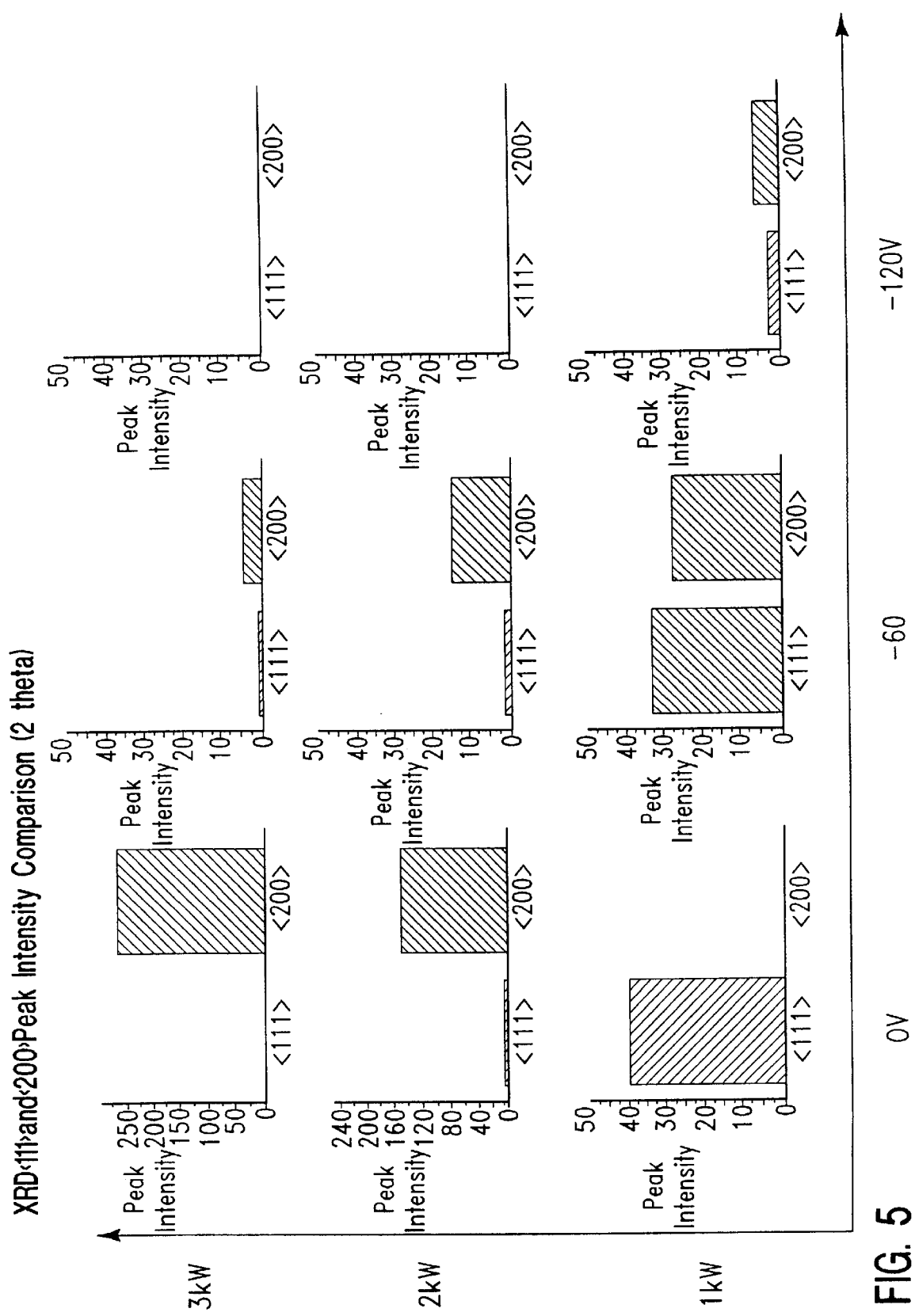
FIG. 5 is a graph showing XRD data for various layers of TiN deposited using RIMP deposition techniques.

FIG. 5 shows a graph of the XRD <111> and <200> grain orientation peak intensities for RIMP deposited TiN layers as a function of the RF power to the ionization coil and the substrate bias in negative voltage. The DC power to the titanium target was 5 kW, and the process chamber pressure was about 20 mT, with gas flow rates of 30 sccm of argon total and 40 sccm of nitrogen. The substrate was clamped to the substrate support platen and the substrate temperature was about 300° C.

The general appearance of a columnar, semi-columnar, or non-columnar structure appears to generally correlate with changes in grain orientation of the TiN$_x$ structure. With reference to FIG. 5, when the RF power to the ionization coil is low (1 kW) and the substrate bias is off, the TiN$_x$ grain orientation is entirely <111>, which provides a columnar structure. An increase in the nitrogen flow rate appears to help to "stuff" the columnar structure. As the RF power to the substrate bias in increased, the TiN$_x$ grain orientation shifts toward <200> which provides a semi-columnar to non-columnar structure. If a sufficient amount of substrate bias is applied, the presence of grain orientation completely disappears, resulting in a non-columnar structure. When the RF power to the ionization coil is at a moderate to high (2 kW–3 kW) level, the TiN$_x$ grain structure is such that a non-columnar appearance is observed even with no substrate bias applied.

Using the above discovery, applicant has been able to create interfaces between various layers of TiN$_x$ by using

TABLE 1

| FIG. | Layer No. | DC (kW) | RF (kW) | Bias RF (W) | N$_2$ Feed (sccm) | TiN$_x$ (Å) | Description of Layer |
|---|---|---|---|---|---|---|---|
| 4 | 422 | 5 | 0 | 0 | 20 | 195 | C |
| 4 | 424 | 5 | 0 | 0 | 70 | 195 | C |
| 4 | 426 | 5 | 2.5 | 0 | 20 | 195 | C |
| 4 | 428 | 5 | 2.5 | 0 | 70 | 195 | SC |
| 2 | 220 | 5 | 2.5 | 0 | 24 | 200 | C |
| 2 | 228 | 5 | 2.5 | 0 | 64 | 200 | C |
| 4 | 434 | 5 | 2.5 | 100 | 20 | 320 | NC |
| 4 | 436 | 5 | 2.5 | 100 | 70 | 230 | NC |
| 2 | 218 | 5 | 2.5 | 200 | 24 | 180 | SC |
| 2 | 232 | 5 | 2.5 | 200 | 64 | 150 | NC |
| 2 | 230 | 5 | 2.5 | 350 | 24 | 180 | NC |
| 2 | 216 | 5 | 2.5 | 350 | 64 | 150 | NC |
| 2 | 226 | 2.5 | 2.5 | 0 | 24 | 100 | SC |
| 2 | 222 | 2.5 | 2.5 | 0 | 64 | 100 | SC |
| 2 | 224d | 2.5 | 2.5 | 200 | 24 | 90 | NC |
| 2 | 224b | 2.5 | 2.5 | 200 | 64 | 75 | NC |
| 2 | 224a | 2.5 | 2.5 | 350 | 24 | 90 | NC |
| 2 | 224c | 2.5 | 2.5 | 350 | 64 | 75 | NC |
| 4 | 414 | 2.0 | 0 | 0 | 20 | 130 | C |
| 4 | 416 | 2.0 | 0 | 0 | 70 | 130 | C |
| 4 | 418 | 2.0 | 2.5 | 0 | 20 | 90 | SC |
| 4 | 420 | 2.0 | 2.5 | 0 | 70 | 90 | SC |
| 4 | 430 | 2.0 | 2.5 | 100 | 20 | 165 | NC |
| 4 | 432 | 2.0 | 2.5 | 100 | 70 | 165 | NC |

With reference to Table 1 and FIGS. 2 and 4, it becomes readily apparent that when the RF power to the ionization coil is at 2.5 kW and the RF power to the substrate bias is on at any level (from low, 100 kW—to high, 350 kW), the structure of the TiN$_x$ is generally non-columnar in nature. When the RF power to the ionization coil is on and the RF power to the substrate bias is off, the structure of the TiN$_x$ is generally semi-columnar to columnar in nature and may be columnar in nature if the nitrogen flow rate to the reactor is low. When the RF power to the ionization coil is off and RIMP as the layer deposition method and then adjusting the RF power to the ionization coil. It is also possible to create interfaces between layers by application of a sufficiently high substrate bias. The use of substrate bias to create interfacial layers is not as desirable when techniques other than IMP or RIMP are used for deposition, due to the incorporation of argon into the TiN layer. However, when IMP or RIMP is the deposition technique, the ratio of argon ions to metal ions striking the substrate surface is decreased by a factor of 100. In this case, the use of substrate bias to create interfaces between layers provides an acceptable barrier layer composition.

The addition of enough nitrogen to produce stoichiometric TiN is expected to significantly affect the microstructure of the TiN layer, as a columnar structure is not formed at nitrogen contents significantly below stoichiometric. However, the experiments described herein were carried out either at a stoichiometric amount or at an amount in excess of stoichiometric nitrogen. Under these conditions, an increase in the amount of nitrogen feed to the process chamber had little effect on the microstructure of the TiN layer, compared with the effect of a change in RF power to the ionization coil or RF power to the substrate bias.

In view of the results obtained by the experimentation described above, it is readily apparent that the microstructure of a barrier layer formed from a refractory metal compound or a refractory metal nitride can be manipulated by adjustment of the process variables within an IMP or an RIMP process. In particular, an interfacial region can be created within a barrier layer structure which can be used to prevent the migration of silicon to a layer separated from silicon by the barrier layer. The preferred interfacial region is continuous throughout the layer. As an alternative to having a continuous interfacial region, a series of individual layers which provide sufficient interfacial regions can be used in combination to block the migration of the silicon. However, when a number of layers having non-continuous interfaces are to be used, the number of individual layers to be used must be carefully selected, depending on the process used to create the layers, as channels or conduits formed in one layer may continue into another layer. In view of this observation, it appears that at least three or more layers are frequently required to provide reasonable certainty that the silicon will not find a channel from the bottom to the top in a stack of layers.

Further, in order to obtain the best silicon path blocking interface possible, it appears the preferred stack of layers would be one in which non-columnar (preferably amorphous) and columnar layers alternate. A layered structure of this kind can be best be obtained by manipulating the amount of RF power used to provide a substrate bias. In the alternative, the RF power to the ionization coil can be manipulated, with the substrate bias turned off or at a low level.

The precise variation in substrate bias and or power to the ionization coil required to achieve optimum results will be temperature dependent. In view of the disclosure herein, one skilled in the art can adjust the process variables at the process temperature desired to determine the optimum conditions.

The preferred embodiment used to demonstrate the invention was a titanium nitride-comprising barrier layer structure prepared using reactive ion metal plasma deposition techniques. It is expected that refractory metal compounds other than titanium nitride will behave in a similar manner and that the method of the present invention can be used to create barrier layer structures having interfacial regions which prevent the migration of silicon. The preferred embodiment method of forming the titanium nitride barrier layer structure is expected to be useful with regard to these other refractory metal compounds. In particular, the method provides for forming a layered structure of the refractory metal compound, the layered structure comprising at least two individual layers having an interfacial region between them, wherein the interfacial region is at least 10 Å thick. Preferably the barrier layer material is deposited using IMP or RIMP, wherein a layer of barrier layer material is deposited using a substrate bias power which enables the formation of an amorphous structure; and wherein at least one adjacent layer of barrier layer material is deposited in a manner which enables the formation of a structure wherein the majority of the structure has the same grain orientation.

The particular advantage of forming a barrier layer by the method disclosed herein is that it is very economical to be able to apply the entire barrier layer structure in a continuous process, without removing the semiconductor substrate from the process chamber. Since no high temperature annealing step is required to form the silicon-immobilizing barrier layer, fabrication in a single process chamber is easily carried out.

IV. THE METHOD OF APPLICATION OF BARRIER LAYERS AND ALUMINUM

The apparatus in which the preferred embodiments described herein were fabricated was the Endura® Integrated Processing System previously described and illustrated in FIG. 1.

EXAMPLE THREE

The description which follows pertains to the fabrication of an aluminum-filled contact via, wherein the width/length of the contact at the bottom of the via is approximately 0.34 micrometer, and the aspect ratio is approximately 6.7:1.

Figure 3A:
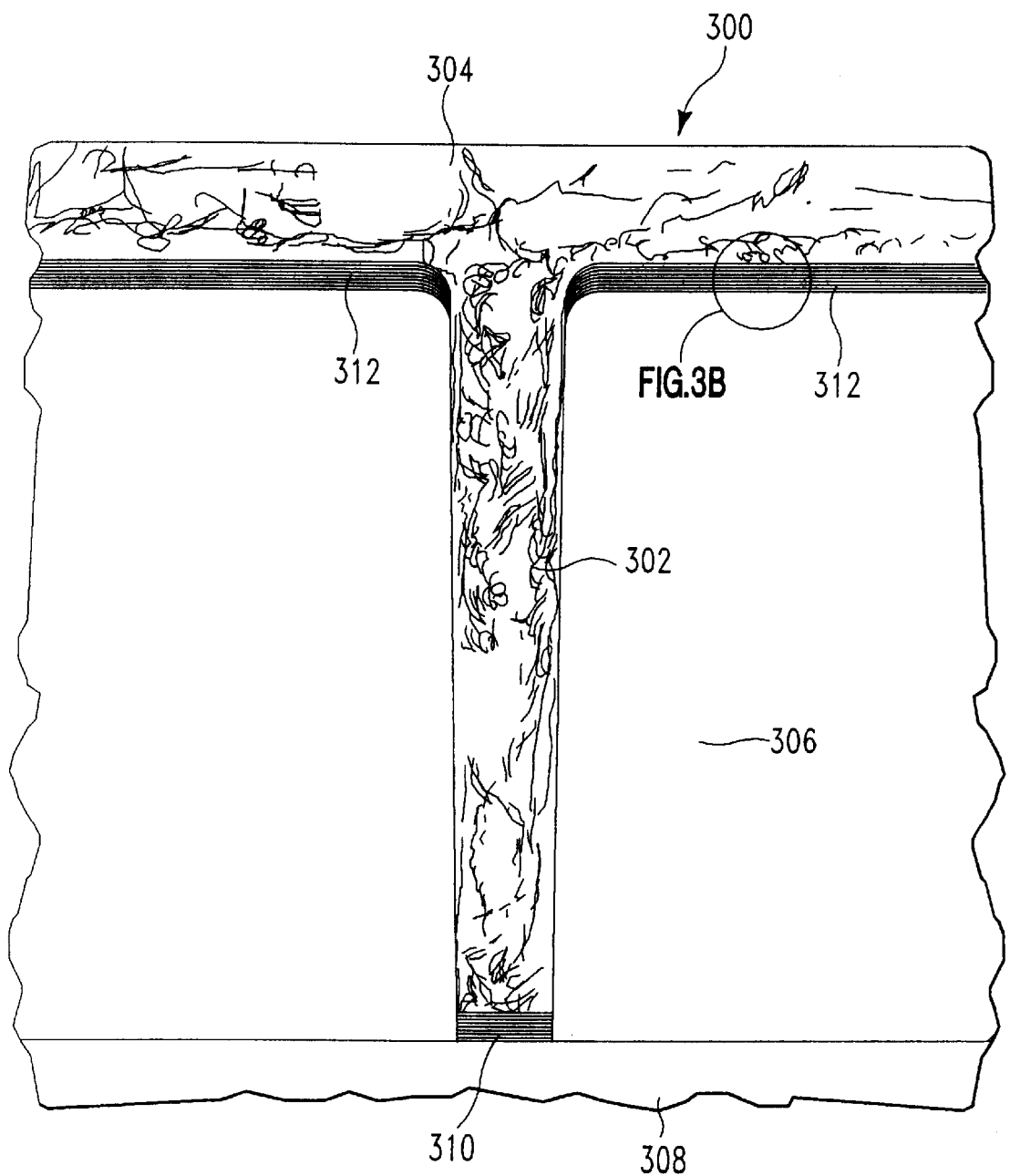
FIG. 3A illustrates a schematic of cross-sectional view of the microstructure (determined by TEM) of a conductive contact formed within a high aspect ratio via, and shows, in particular, a multilayered barrier structure of the kind described in this patent application.

FIG. 3A shows a via structure 300, where the base substrate is a single crystal silicon layer 308, which has a layer of dielectric 306 applied thereover, with a contact via 301 etched through dielectric layer 306 to reach silicon layer 308. An aluminum layer 305 is applied over the upper surface of dielectric layer 306 to provide an aluminum fill 302 within contact via 301.

It is known in the art that a contact via having a contact dimension of 0.34 micrometer and an aspect ratio of 6 or better is particularly difficult to aluminum fill without creating voids during the fill. To enable easier filling of the contact via, Xu et al. (as described in U.S. patent application Ser. No. 08/511,825, filed Aug. 7, 1995 now U.S. Pat. No. 5,962,923) developed a technique for application of ion metal plasma deposited titanium nitride-comprising barrier layer which enabled aluminum flow into the via. In particular, the titanium nitride-comprising barrier layer acts as a carrier layer. The carrier layer enables the filling of apertures such as vias, holes or trenches of high aspect ratio and the planarization of a conductive film deposited over the carrier layer at reduced temperatures compared to prior art methods.

To prevent migration of the silicon 308 into aluminum fill 302, it is desired to further develop the structure of barrier layer 312 in the area interface 310 between silicon 308 and aluminum fill 302.

Figure 3B:
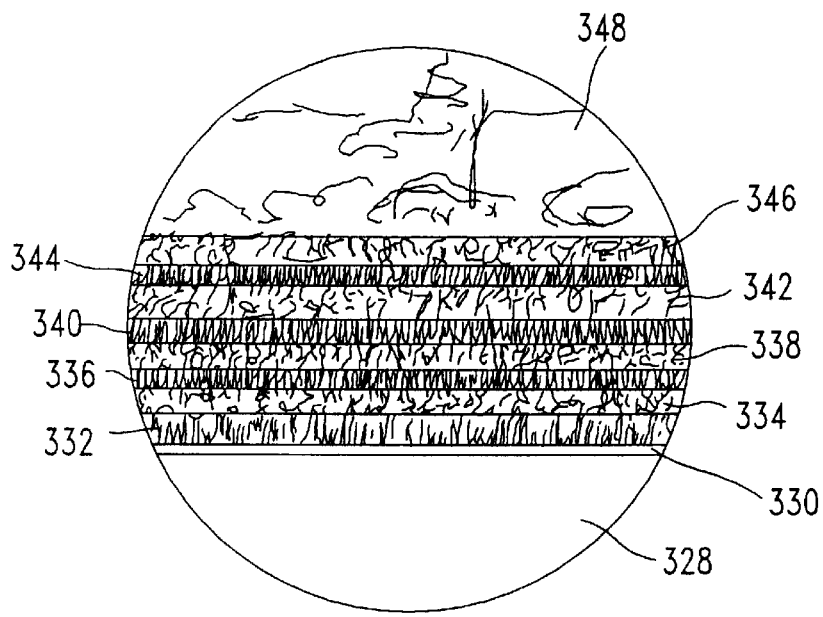
FIG. 3B is a schematic of an enlargement of the area marked 3B on FIG. 3A, for purposes of discussing tile microstructure of the individual layers within the multilayered structure.

Using the concepts described in previous examples above, a first layer of Ti, followed by seven layers of $TiN_x$ were applied in a manner to produce alternating layers of amorphous and crystalline, columnar microstructure. With reference to FIG. 3B, which is an enlargement of the barrier layer structure shown in FIG. 3A at the upper surface of dielectric layer 306, the substrate 328 is silicon oxide, the first layer 330 is generally resputtered oxide. The second layer 332 is a layer of titanium. Subsequent layers 334 through 346 are TiN layers. TiN layer 334 has an amorphous microstructure, and TiN layer 336 has a grain-oriented, columnar microstructure. TiN layer 338 has an amorphous microstructure and TiN layer 340 has a grain-oriented, columnar microstructure. TiN layer 342 has an amorphous microstructure and TiN layer 344 has a grain-oriented, columnar microstructure. TiN layer 346 has an amorphous microstructure. Aluminum fill 348 is shown overlying TiN$_x$ layer 346.

All Ti and TiN layers were deposited at a substrate temperature of about 100° C. The RF frequency for the power applied to the ionization coil was 13.56 MHz. The RF frequency for the power applied to the substrate support pedestal was 400 kHz (however, this frequency is not as effective/efficient as 13.56 MHz and the latter is recommended to one skilled in the art). The titanium layer 332 was deposited using 2 kW of DC to the titanium target, 2.5 kW to the RF ionization coil, no power applied to bias the substrate, an argon flow rate to the substrate support platen of about 15 sccm, and an argon flow rate to the upper portion of the process chamber of about 67 sccm. Under these conditions, the process chamber pressure was about 35 mT. Amorphous, non-columnar TiN layer 334 was deposited using 5 kW of DC to the titanium target, 2.5 kW to the RF ionization coil, 450 W of RF power applied to the substrate support platen to bias the substrate (approximately −300 V), an argon flow rate to the substrate support platen of about 15 sccm, an argon flow rate to the upper portion of the process chamber of about 10 sccm, and a nitrogen flow rate to the upper portion of the process chamber of about 70 sccm (chamber pressure approximately 35 mT). Grain-oriented, columnar TiN layer 336 was deposited using 2.5 kW of DC to the titanium target, 2.5 kW to the RF ionization coil, no power to bias the substrate (resulting in a substrate self-bias of about −20 V), an argon flow rate to the substrate support platen of about 15 sccm, an argon flow rate to the upper portion of the process chamber of about 10 sccm, and a nitrogen flow rate to the upper portion of the process chamber of about 20 sccm (chamber pressure approximately 17 mT). Amorphous TiN layers 338, 342, and 346 were applied using the same process conditions as those specified for layer 334. Grain-oriented TiN layers 336, 340, and 344 were applied using the same process conditions as those specified for layer 336.

The barrier layer structure obtained in the area of contact interface 310 mirrored that obtained at the FIG. 3B location except that the layers were thinner, as the bottom coverage for barrier layers deposited at the base of via 301 was about 35% of that obtained at the upper surface of dielectric 306. A very thin, continuous layer of TiN$_x$ was also observed on the sidewalls of via 301.

A barrier layer structure of the kind described above and similar structures produced during the development process were tested using two well-established physical "spiking" techniques. The metal process/stack used during the "spiking" evaluations was approximately: 200 Å titanium, 800 Å titanium nitride, 400 Å titanium, and 10,000 Å aluminum (0.5% copper). In each barrier evaluation technique, the wafer to be tested was thermally stressed by subjecting the wafer to a furnace anneal. The annealing conditions encourage atom migration and diffusion such that a poor quality barrier will allow the silicon atoms to migrate to the aluminum. Aluminum atoms then migrate down to the silicon and "spiking" occurs. Test Method 1 is known as Cross-sectional SEM. The wafer is cleaved through an array of contacts and cross-sectional images are taken. Any consumption of the silicon substrate originating at a contact is considered spiking. Test Method 2 is known as Top down optical inspection after strip. After the furnace anneal, the metal stack and the dielectric (normally some form of oxide) is etched (stripped off) the wafer. All that remains is the silicon wafer. If spiking has occurred, defects in the silicon crystal are visible. This method allows inspection of potentially all contacts on the wafer.

The barrier layer structures of the kind described above (and similar structures) in the form of contacts having a feature size ranging from about 0.35 μm to about 1.0 μm and an aspect ratio ranging from about 2:1 to about 6:1 were tested and showed no evidence of spiking.

Although the preferred embodiments described above were with reference to a TiN-comprising barrier layer structure underlying an aluminum conductor, the same barrier layer structure is expected to work equally well when used as a liner for a tungsten plug.

The above described preferred embodiments are not intended to limit the scope of the present invention, as one skilled in the art can, in view of the present disclosure expand such embodiments to correspond with the subject matter of the invention claimed below.

I claim:

1. A method of forming a barrier layer structure from a refractory metal compound on a semiconductor substrate, said method comprising the following steps:

a) depositing at least one layer of said refractory metal compound using a deposition technique which provides an amorphous, non-columnar microstructure;

b) depositing at least one adjacent layer of said refractory metal compound using a deposition technique which provides a grain-oriented, columnar or semi-columnar microstructure, wherein said resulting barrier layer structure comprises at least two adjacent layers having an essentially continuous interfacial region between them, and wherein said interfacial region is at least 10 Å thick.

2. The method of claim 1, wherein either of said adjacent layers is deposited using an ion metal plasma or a reactive ion metal plasma deposition technique.

3. The method of claim 2, wherein all of said barrier layer structure layers are deposited using an ion metal plasma or a reactive ion metal plasma deposition technique.

4. A method of forming a barrier layer structure from a refractory metal compound on a semiconductor substrate, wherein said barrier layer structure comprises at least three layers of essentially the same chemical composition, and wherein at least one of said layers has a grain-oriented, columnar or semi-columnar microstructure and at least one of said layers has an amorphous, non-columnar microstructure, said method comprising the steps of:

a) depositing at least one layer of a refractory metal compound using a deposition technique which provides an amorphous, non-columnar microstructure, wherein said layer thickness is at least 50 Å;

b) depositing at least one layer of said refractory metal compound using a deposition technique which provides a grain-oriented, columnar or semi-columnar microstructure, wherein said layer thickness is at least 50 Å; and c) depositing at least one additional layer of a refractory metal compound using the deposition technique of a) or b), wherein said depositing of said layers produces of at least two interfacial regions within said barrier layer structure, and wherein said at least two interfacial regions are useful in blocking migration.

5. The method of claim 4, wherein either said layer having an amorphous, non-columnar microstructure or said layer having a grain-oriented columnar or semi-columnar microstructure is deposited using an ion metal plasma or a reactive ion metal plasma deposition technique.

6. The method of claim 5, wherein all of the layers are deposited using an ion metal plasma or a reactive ion metal plasma deposition technique.

7. The method of claim 1, wherein said interfacial region is useful in blocking migration of mobile atoms into an adjacent layer of a composition other than said barrier layer structure, by breaking the continuity of channels passing through said interfacial region.

8. The method of claim 1 or claim 3, wherein a change from said amorphous, non-columnar microstructure to said columnar or semicolumnar microstructure is achieved by changing a deposition process variable.

9. The method of claim 8, wherein said deposition process variable is selected from the group consisting of: source power, substrate bias, nitrogen gas feed rate to a reaction chamber, and combinations thereof.

10. The method of claim 9, wherein said deposition process variable is source power.

11. The method of claim 9, wherein said deposition process variable is nitrogen gas feed rate.

12. The method of claim 1, wherein steps a) and b) are performed in a single processing chamber.

* * * * *